(12) United States Patent
Faue

(10) Patent No.: US 6,621,747 B2
(45) Date of Patent: Sep. 16, 2003

(54) INTEGRATED DATA INPUT SORTING AND TIMING CIRCUIT FOR DOUBLE DATA RATE (DDR) DYNAMIC RANDOM ACCESS MEMORY (DRAM) DEVICES

(75) Inventor: Jon Allan Faue, Colorado Springs, CO (US)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/287,210

(22) Filed: Nov. 4, 2002

(65) Prior Publication Data

US 2003/0063514 A1 Apr. 3, 2003

Related U.S. Application Data (62) Division of application No. 09/955,234, filed on Sep. 18, 2001, now Pat. No. 6,563,747, which is a division of application No. 09/527,043, filed on Mar. 16, 2000.

(51) Int. Cl.$^7$ ................................................. G11C 7/00
(52) U.S. Cl. ................... 365/194; 365/193; 365/189.07
(58) Field of Search ............................ 365/193, 230.01, 365/230.05, 189.07, 189.08, 194

(56) References Cited

U.S. PATENT DOCUMENTS

| | | | |
|---|---|---|---|
| 5,610,862 A | 3/1997 | Teel | |
| 5,978,281 A | 11/1999 | Anand et al. | |
| 6,034,916 A | 3/2000 | Lee | |
| 6,081,477 A | 6/2000 | Li | |
| 6,091,663 A | 7/2000 | Kim et al. | |
| 6,101,612 A | 8/2000 | Jeddeloh | |
| 6,134,180 A | 10/2000 | Kim et al. | |

*Primary Examiner*—Richard Elms
*Assistant Examiner*—Hien Nguyen
(74) *Attorney, Agent, or Firm*—William J. Kubida; Hogan & Hartson LLP (57) ABSTRACT

An integrated data input sorting and timing circuit for double data rate ("DDR") dynamic random access memory ("DRAM") devices in which a sorting of the input data into odd/even is integrated with the necessary timing to allow synchronization with the on-chip Y-clock signal (column address select) without the need to provide separate circuits. In those devices having multiple DQS inputs, any skew between DQS pins is allowed as long as no one DQS pin violates the DQS-to-clock ("DQS-CLK") skew requirements. The circuit and method of the present invention also allows a write to occur at command +2 cycles (last data +½). Functionally, both rising and falling data (i.e., data on the rising and falling edges of DQS) is captured by the DQS inputs and presented in parallel to the chips internal write path and data is passed on the falling edge of DQS. Rising edge data ("Redat") signals then specify whether the rising edge data should be mapped to the even or odd field, with falling edge data being directed to the opposite field. The timing of the rising edge data signals is such that the internal odd and even data buses only transition prior to a given write clock, and don't transition during the write clock itself. This is supported over a large range of positive and negative DQS-to-clock skews.

16 Claims, 5 Drawing Sheets

# INTEGRATED DATA INPUT SORTING AND TIMING CIRCUIT FOR DOUBLE DATA RATE (DDR) DYNAMIC RANDOM ACCESS MEMORY (DRAM) DEVICES

RELATED APPLICATION

The present application is a division of U.S. patent application Ser. No. 09/955,234 filed Sep. 18, 2001, now a U.S. Pat. No. 6,563,747, incorporated herein by reference in its entirety, which is assigned to the assignee of the present application which is a Divisional of 09/527,043 filed Mar. 16, 2000.

BACKGROUND OF THE INVENTION

The present invention relates, in general, to the field of integrated circuit double data rate ("DDR") dynamic random access memory ("DRAM") devices. More particularly, the present invention relates to an integrated data input sorting and timing circuit for DDR DRAM memory devices.

Historically, in order to synchronize data transfers among system logic devices, data transfers to/from conventional DRAM devices would be initiated on either the rising (the transition from logic level "zero" to "one") or falling (the transition from logic level "one" to "zero") edge of a clock signal. DDR DRAM memory devices differ from conventional DRAM by enabling output operations to occur on both the rising and falling edges of the clock, thereby effectively doubling the device's output frequency without increasing the actual clock frequency.

For certain DDR DRAM device specifications, at least two specific problems have been identified pertaining to write cycles. Firstly, data is gathered on the rising and falling edge of the DQS strobe (or multiple strobes in, for example, x16 memory devices), but the rising edge can correspond to either a condition C0=0 or condition C0=1. The falling edge data is then the opposite, where C0 is the AØ address at column time. Each successive write cycle can switch between C0=0 (even start) or C0=1 (odd start). Secondly, the position of the DQS strobe relative to the system clock can have up to a 25% shift. However, as a practical matter a good design must be able to tolerate a much larger skew than the specification value so as to provide sufficiently ample operating margin.

SUMMARY OF THE INVENTION

In accordance with the present invention, the sorting of the input data into odd/even in a DDR DRAM memory device is integrated with the necessary timing to allow synchronization with the on-chip Y-clock signal (column address select) without the need to provide separate circuits to handle the odd/even sorting function and synchronization to the Y-clock function.

For cases with multiple DQS inputs (e.g., DQS(0:1)), any skew between DQS pins is allowed as long as no one DQS pin violates the DQS-to-clock ("DQS-CLK") skew requirements. The circuit and method of the present invention also allows a write to occur at command +2 cycles (last data+½) while conventional approaches may, in fact, write at a later time in an attempt to solve the foregoing issues.

In operation, both rising and falling data (i.e., data on the rising and falling edges of DQS) is captured by the DQS inputs and presented in parallel to the chips internal write path and data is passed on the falling edge of DQS. Rising edge data ("Redat (0:1)") signals produced as disclosed herein, then specify whether the rising edge data should be mapped to the even (0) or odd field (1), with falling edge data being directed to the opposite field. The timing of the Redat signals is such that the internal odd and even data buses (G-buses) only transition prior to a given write clock ("Yw-clock"), and don't transition during the write clock itself. This is supported over a large range of positive (+) and negative (−) DQS-to-clock skews. Another Redat pair (0:1) is added for each additional DQS signal. As previously mentioned, there is no restriction on DQS-DQS skew, only DQS-CLK.

Briefly, disclosed herein is a method for handling data in an integrated circuit memory device comprising the steps of: capturing the data on opposite first and second transitions of a data strobe signal; selectively mapping the data captured on the first transition of the data strobe signal to a first data path and the data captured on the second transition to a second data path; latching the data on the first and second data paths when an internal write clock signal is active; and passing the data on the first and second data paths to respective internal output nodes when the internal write clock signal is not active.

Further disclosed herein is an integrated circuit memory device having a synchronizing clock signal and including a plurality of external data input paths. The memory device comprises a write data sort circuit for loading data applied to the external data input paths on a first transition of the synchronizing clock signal to either a first or second internal data path and alternatively loading data applied to the external data input paths on a second opposite transition of the synchronizing clock signal to the opposite one of the first or second internal data paths. The memory device further comprises a data-in sort clock circuit for operatively controlling the write data sort circuit and receiving the synchronizing clock signal and a data strobe signal for causing the write data sort circuit to latch the data on the first and second data paths when an internal write clock signal is active and to pass the data on the first and second data paths to respective internal output nodes when the internal write clock signal is not active.

Still further disclosed is a double data rate memory device comprising a write data sort circuit coupled to receive a first plurality of parallel data bits on a first internal data path on a rising edge of a data strobe clock and a second like plurality of parallel data bits on a second internal data path on a falling edge of the data strobe clock. The write data sort circuit is operative in association with a data-in sort clock circuit for selectively mapping the first plurality of parallel data bits to one of an even or odd data field and alternatively mapping the second plurality of parallel data bits to an opposite one of the even or odd data fields.

Also disclosed is a double data rate memory device comprising a data-in sort clock circuit coupled to an internal write clock of the memory device, the data-in sort clock circuit in operative association with a write data sort circuit to enable even and odd data fields stored therein to be applied to respective internal output nodes when the internal write clock is in a first state thereof and to alternatively disable application of the even and odd data fields to the respective internal output nodes when the internal write clock is in a second opposite state thereof.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
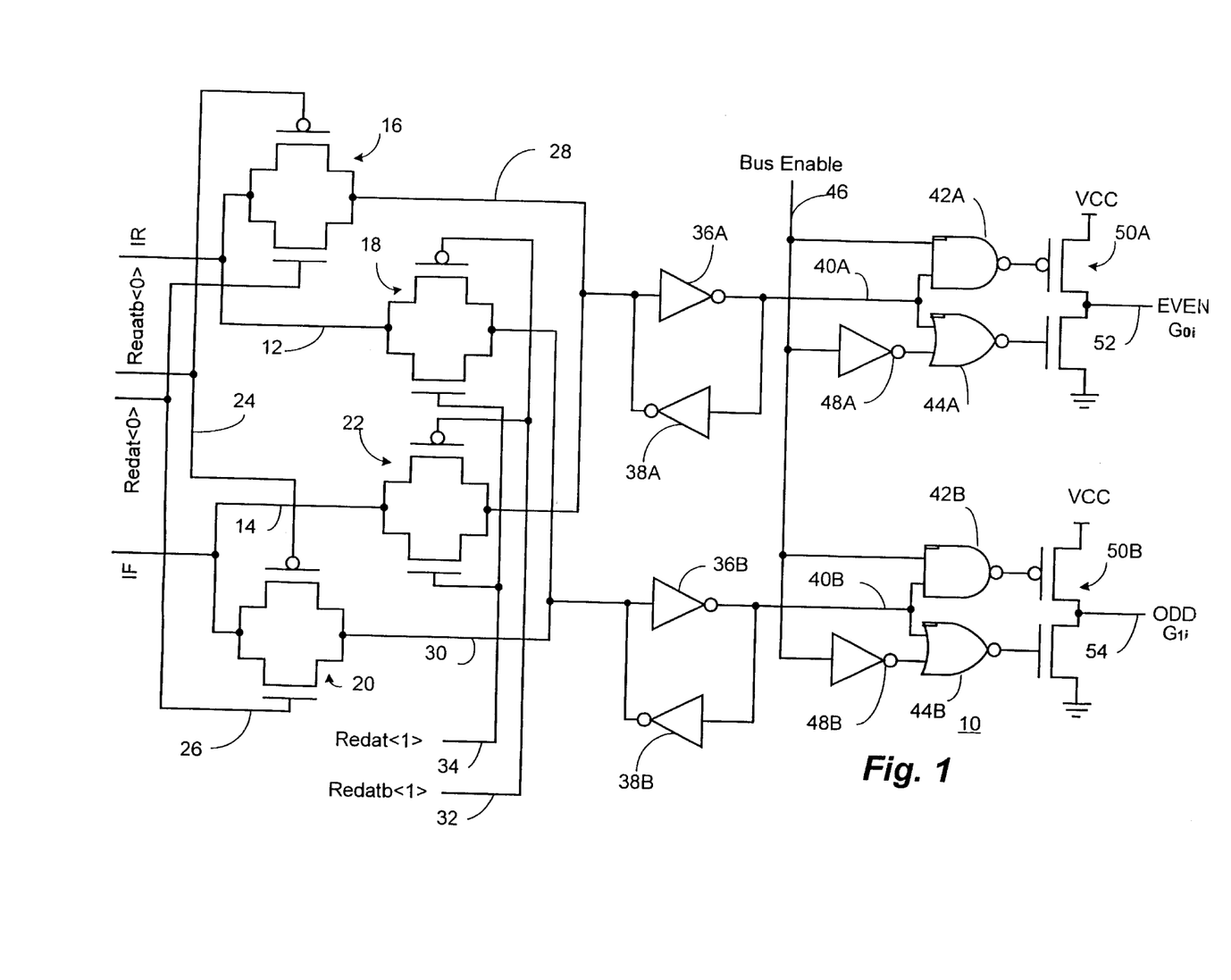
FIG. 1 is a detailed schematic and functional block diagram of a representative write data sort ("WDSORT") circuit in accordance with a specific embodiment of the present invention.

With reference now to FIG. 1, a detailed schematic and functional block diagram of a representative write data sort ("WDSORT") circuit 10 in accordance with a specific embodiment of the present invention is shown. The circuit 10 receives an input rising ("IR") data input on line 12 and an input falling ("IF") data input on line 14 from the same device input/output ("I/O") pad. The IR data on line 12 is coupled to the input nodes of first and second groups 16, 18 of parallel connected P-channel and N-channel transistor pairs. In like manner, the IF data on line 14 is coupled to the input nodes of third and fourth groups 20, 22 of parallel connected P-channel and N-channel transistor pairs.

The gate terminals of the P-channel transistors of the first and third groups 16, 20 of transistor pairs are coupled to a Redatb<0> (Redat "bar", the complement of the signal Redat<0>) input 24 while the gate terminals of the N-channel transistors of the first and third groups 16, 20 of transistor pairs are coupled to a Redat<0> input 26. The output nodes of the first and fourth groups 16, 22 of transistor pairs are common connected at node 28 while the output nodes of the second and third groups 18, 20 of transistor pairs are common connected at node 30. The gate terminals of the P-channel transistors of the second and fourth groups 18, 22 of transistor pairs are coupled to a Redatb<1> input 32 while the gate terminals of the N-channel transistors of the second and fourth groups 18, 22 of transistor pairs are coupled to a Redat<1> input 34.

Nodes 28 and 30 are respectively coupled to the input terminals of inverting amplifiers 36A and 36B as well as the node intermediate series connected P-channel and N-channel transistor pairs 38A and 38B with are coupled between a source of supply voltage ("VCC") and circuit ground. The gate terminals of the P-channel and N-channel transistors in the series connected transistor pairs 38A and 38B are common connected respectively to the output of inverting amplifier 36A at node 40A and inverting amplifier 36B respectively at node 40B.

Nodes 40A and 40B are coupled to one input of two input NAND gates 42A and 42B as well as one input of two input NOR gates 44A and 44B respectively. A bus enable signal on input 46 is coupled to the other input of the NAND gates 42A and 42B as well as to the remaining input of NOR gates 44A and 44B through respective inverting amplifiers 48A and 48B as shown. The output of the NAND gates 42A and 42B as well as the output of the NOR gates 44A and 44B are respectively coupled to the gate terminal of series connected P-channel and N-channel transistor pairs 50A and 50B as shown, the transistor pairs 50A and 50B being coupled between VCC and circuit ground. The output node of series connected transistor pair 50A provides an "EVEN" output signal (G0i) on line 52 while the output node of series connected transistor pair 50B provides an "ODD" output signal (G1i) on line 54.

A write data sort circuit 10 as illustrated may be, in the case of a DDR DRAM memory device incorporating the same, placed in each of the device data paths. It is operative to create odd and even bits from rising and falling edge data as will be more fully described hereinafter. The function of the WDSORT circuit 10 is relatively straightforward and it is operative to load either the rising or falling data onto the even path, load the opposite state data onto the odd path and keep the data latched until another load command (Redat) is received.

Figure 2:
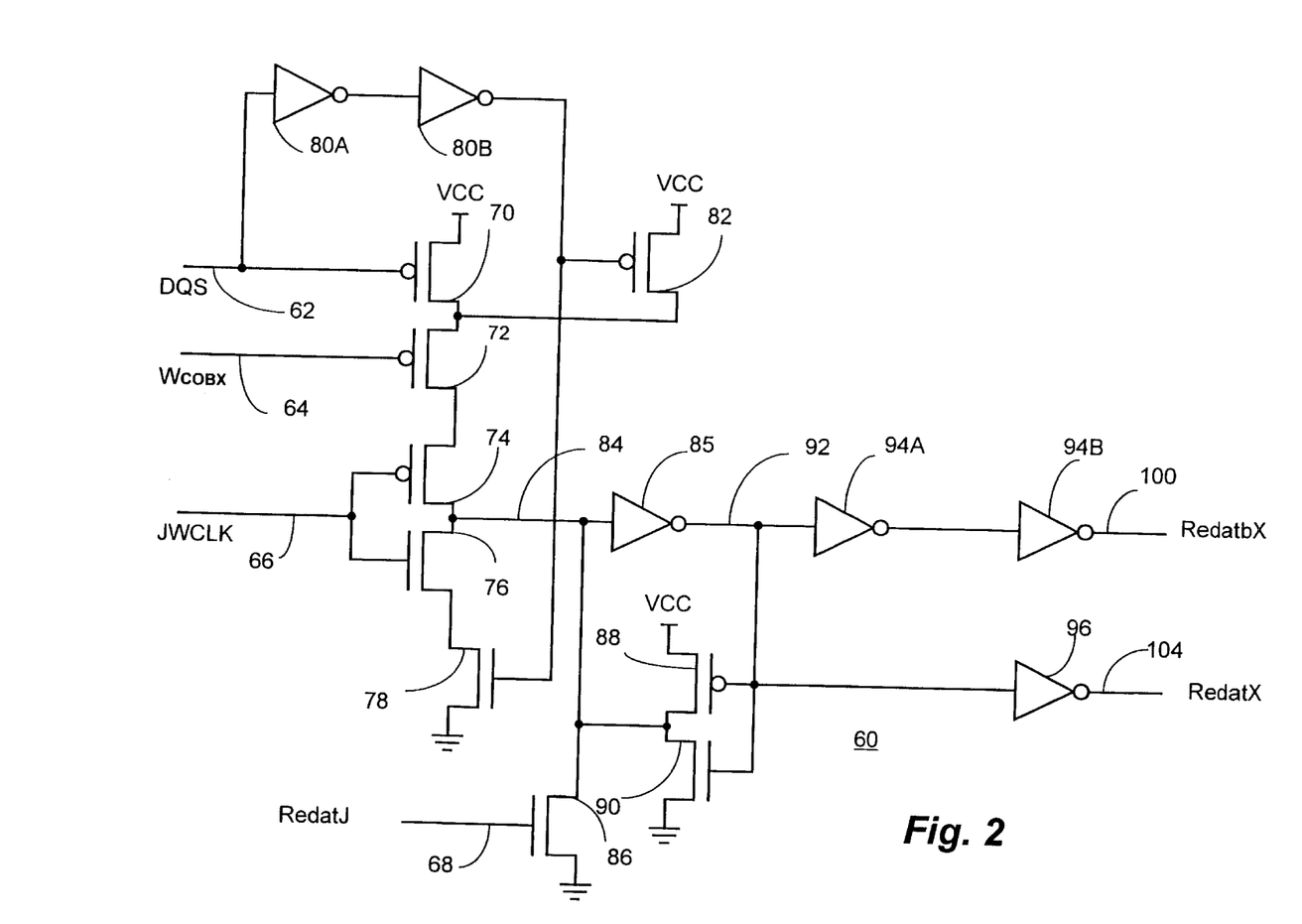
FIG. 2 is an accompanying detailed schematic and functional block diagram of a rising edge data ("Redat") data-in sort clock circuit.

With reference additionally now to FIG. 2, a rising edge data ("Redat") data-in sort clock circuit 60 is shown which is associated with each group of WDSORT circuits 10 (FIG. 1). The circuit 60 receives as inputs a DQS input signal (data input strobe signal which is indicative of when data transitions are taking place, i.e. is "rising data" valid, or "falling data" valid) on line 62, a $W_{COBX}$ signal (where x=0 or 1 depending on the state of A0 at the time the "write" command was given) on line 64 and a JWCLK signal (the chip clock signal "JCLK" with two inversion delays) on line 66. These signals are input to a series connected transistor string comprising P-channel transistors 70, 72 and 74 in series with N-channel transistors 76 and 78 coupled between VCC and circuit ground. The DQS and $W_{COBX}$ signals on lines 62 and 64 are respectively coupled to the gate terminals of P-channel transistors 70 and 72 while the JWCLK signal on line 66 is coupled to the gate terminals of P-channel transistor 74 and N-channel transistor 76. The DQS signal on line 62 is coupled to the gate of N-channel transistor 78 through series connected inverting amplifiers 80A and 80B, which delayed signal is also coupled to the gate terminal of P-channel transistor 82 which is coupled between VCC and the node intermediate P-channel transistors 70 and 72. It should be noted that the delay due to inverting amplifiers 80A and 80B is minimal and, in some circuit 60 implementations, they may not be required.

An output node 84 intermediate P-channel transistor 74 and N-channel transistor 76 is coupled to the input of inverting amplifier 85 as well as selectively coupled to the node intermediate series connected P-channel transistor 88 and N-channel transistor 90 coupled between VCC and circuit ground. Output node 84 is selectively couplable to circuit ground through N-channel transistor 86 which has its gate terminal coupled to receive a RedatJ signal on input line 68.

The output of inverting amplifier 85, at node 92, is coupled to the common connected gate terminals of P-channel transistor 88 and N-channel transistor 90 as well as the input of series connected inverting amplifiers 94A and 94B. The output of inverting amplifier 94B provides a "RedatbX" (Redat "bar" X) signal on output line 100. An additional inverting amplifier 96 has its input coupled to node 92 and provides a "RedatX" signal on output line 104.

Circuit 60 is placed twice for each DQS signal and the associated input data bits and is operative such that, if Redat<1>=1 then Redat<0>=0 and vice versa. The first placement has $W_{COB(X=0)}$ for the case in which C0=0. The second placement has $W_{COB(X=1)}$ for the case in which C0=1. For JWCLK=0 and DQS=0, the state of $W_{COBX}$ is evaluated. If at that time $W_{COBX}$ is also =0, then the associated Redat(X)=1. For C0=0, $W_{COB}$<0>=0 then Redat<0>=1. Since $W_{COB}$<1>=1, Redat<1> must remain =0. For the case in which C0=1, $W_{COB}$<1>=0, Redat<1>=1 and Redat<0>=0 ($W_{COB}$<0>=1).

Based on which Redat signal (0 or 1) is active "high", the input data from the rising edge of DQS will be passed on to the "even" or "odd" (0 or 1) internal write bus in the WDSORT circuit 10. The input data from the falling edge will be passed on to the opposite write bus. When DQS=1 and JWCLK=1, all Redats=0 and no further transmission of data onto the internal write bus is allowed since a "write" operation is underway and cannot be disturbed. If DQS=0 but JWCLK=1, the Redat signals remain in their previous state. The same is true for the case in which DQS=1 and JWCLK=0. It should be noted that $W_{COBX}$ is based on the write address, but shifted one full clock cycle so as to align the Redat signals in the correct place.

With respect to this figure, it should be noted that, functionally, an attempt is made to write data in coincidence with the memory device system clock itself. However, due to the latencies inherent in this process, the data is collected prior to the write operation on the Y-clock, which is itself synchronized with the system clock. The circuit 60 is operational to make a determination as to even/odd sorting and skew sorting in a single function with the upper portion of the circuit 60 effectuating the rising edge even/odd sorting and the lower portion carrying out the skew sorting. Each time the JWCLK signal on line 66 and the DQS signal on line 62 are both at a logic "low" level, another condition is interrogated as to "odd" or "even". If the JWCLK signal and the DQS signal are both "high", then all write data is trapped and all Redats must be "off" to avoid any potential data corruption. It should be noted that if only the DQS signal goes "high", (or if only JWCLK goes "high") this will not reset the latch.

Figure 3:
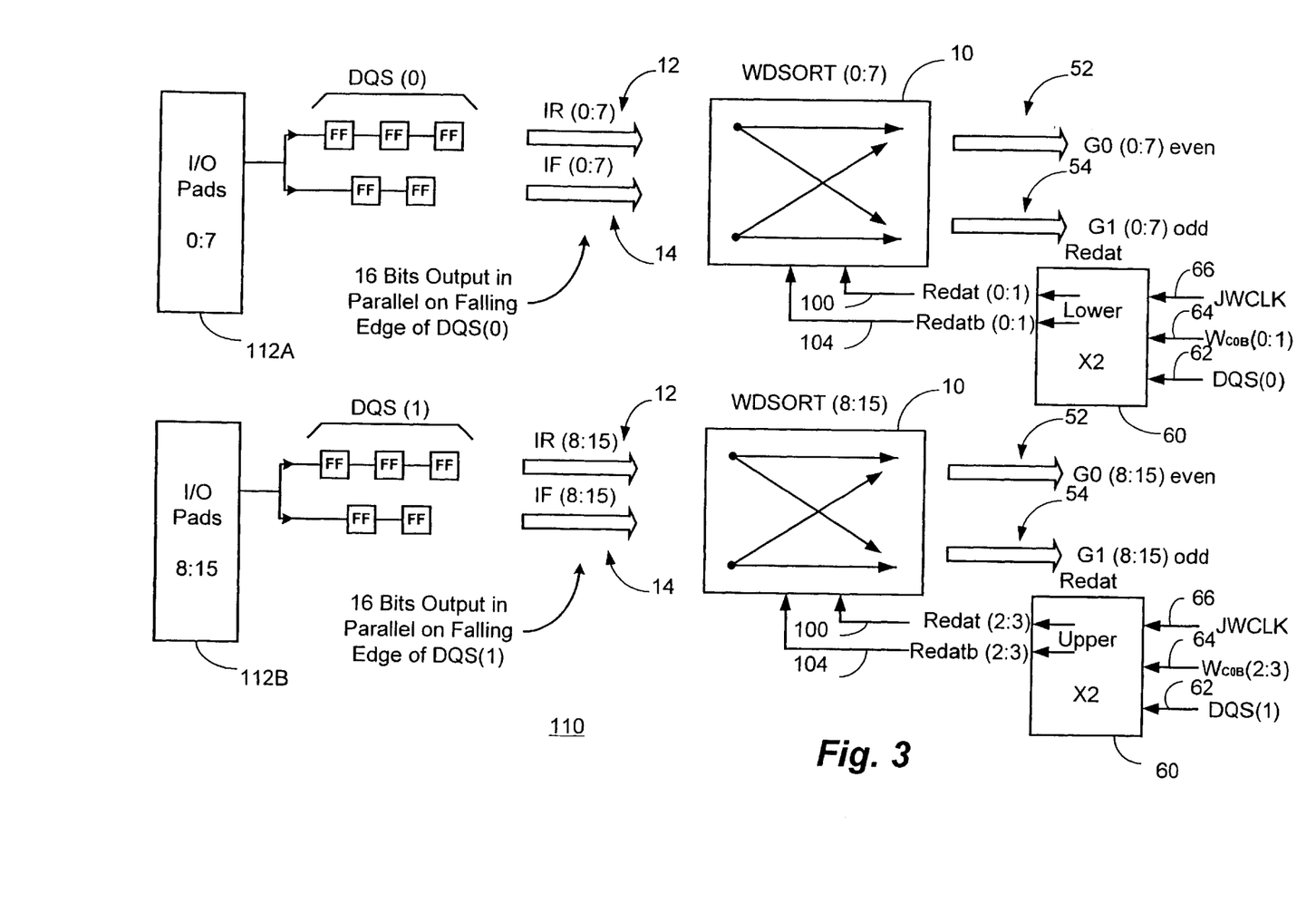
FIG. 3 is a functional block diagram of the input/output pads, input data path, WDSORT and data-in sort clock circuits of the preceding figures in a representative 64 MB DDR DRAM memory device in accordance with a specific embodiment of the present invention.

With reference additionally now to FIG. 3, a functional block diagram of the memory device input/output pads, input data paths, WDSORT circuit 10 and Redat data-in sort clock circuit 60 of the preceding figures is shown in a representative 64 MB DDR DRAM memory device in accordance with a specific embodiment of the present invention. It should be noted that in this illustration there are two Redat data-in sort circuits 60 (X2) associated with each WDSORT circuit 10. Like structure and signals to that previously described with respect to the foregoing figures is like numbered and the foregoing description thereof shall suffice herefor.

The signal $W_{COB}$ (Write C0 bar) on line 64 indicates the status of the A0 input at the time of the write command was issued and is active "low". The JWCLK signal on line 66 is the internal memory device clock (JCLK) buffered with two gate delays. The signals Redat(0) [C0=0] and Redat(1) [C0=1] on lines 100, 104 are associated with the lower byte of data on the I/O pads 112A[0:7] while the signals Redat(2) [C0=0] and Redat(3) [C0=1] also on lines 100, 104 are associated with the upper byte of data on the I/O pads 112B [8:15].

Figures 4, 5:
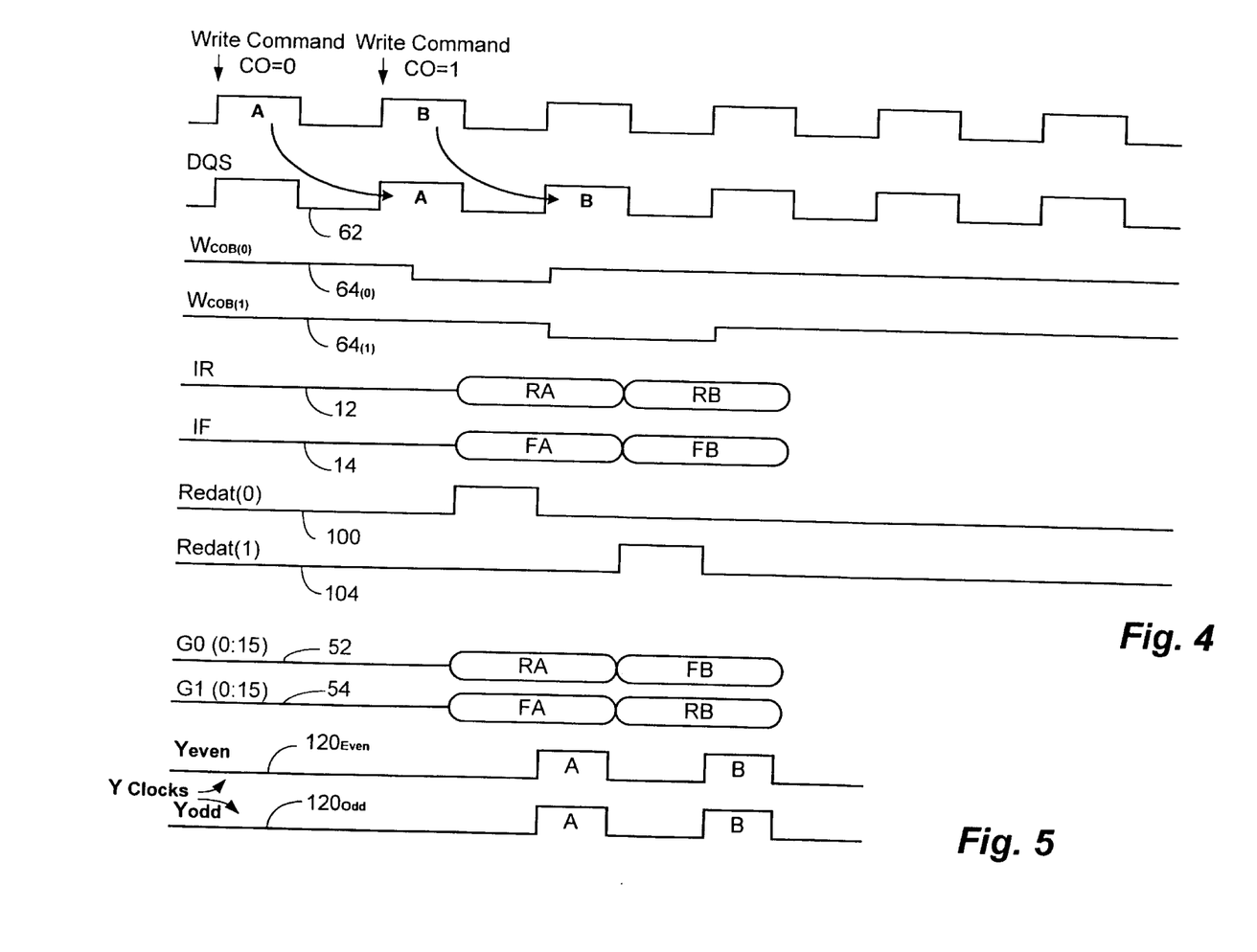
FIG. 4 is a representative timing diagram illustrating the interrelationship of a number of signals showing the write timing that can be achieved through the use of the WDSORT and data-in sort clock circuits of the preceding figures.
FIG. 5 is an accompanying representative timing diagram illustrating the capability provided for the writing of even and odd fields at the same time without regard to whether the source of the data was the rising or falling edge.

With reference additionally now to FIG. 4, a representative timing diagram is presented illustrating the interrelationship of a number of signals showing the write timing that can be achieved through the use of the WDSORT circuit 10 and Redat data-in sort clock circuit 60 of the preceding figures. Taken in conjunction with this figure, FIG. 5 is an accompanying representative timing diagram illustrating the capability provided for the writing of even and odd fields at the same time without regard to whether the source of the data was the rising or falling edge. Again, like structure and signals to that previously described with respect to the foregoing figures is like numbered and the foregoing description thereof shall suffice herefor.

As illustrated, in accordance with the technique of the present invention, the rising and falling data is gathered with the DQS clock and presented to the memory device as 2 times the I/O width. Stated another way, the rising and falling data is collected and placed in parallel (e.g. 32 bits for a x16 DDR memory device, 8 bits for a x4 DDR memory device, etc.). The data is then passed through the sorting clock integrator circuit, which determines which data, rising or falling, corresponds to the even and odd address fields. A determination is also made when the data can be passed through and it when it must be held off. The data is the written, at a full 2 times the I/O width, synchronized to the chip clock.

Figure 6:
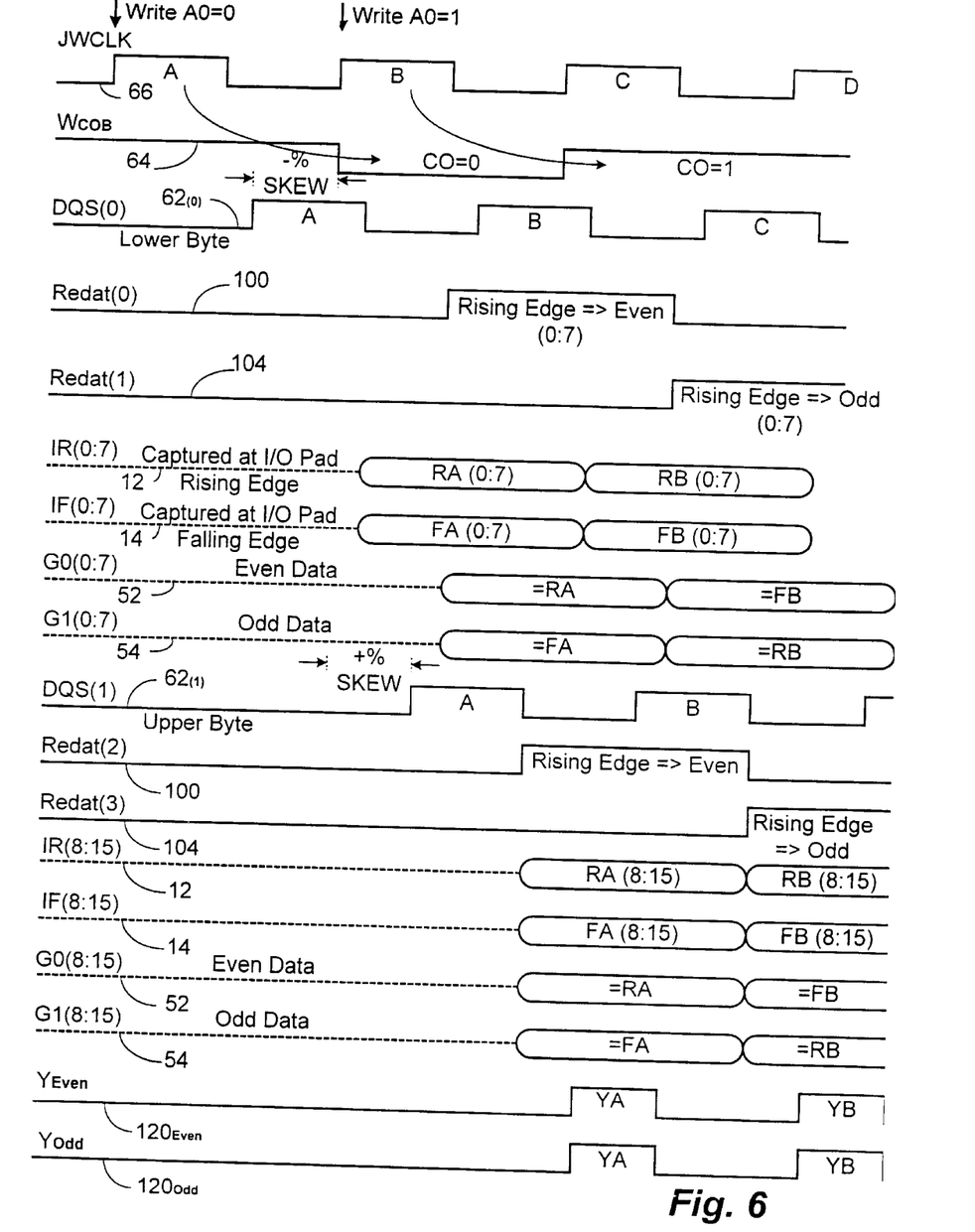
FIG. 6 is a representative timing diagram illustrative of a worst case timing example in a x16 DDR DRAM where DQS(0) and DQS(1) have maximum skew and two different C0 values (e.g., C0=0 and C0=1) in consecutive write cycles.

With reference additionally now to FIG. 6, a representative timing diagram is presented illustrative of a worst case timing example in a x16 DDR DRAM memory device where DQS(0) 62$_{(0)}$ and DQS(1) 62$_{(1)}$ have maximum skew and two different C0 values (e.g., CO=0 and CO=1) in consecutive write cycles. Once more, like structure and signals to those previously described with respect to the foregoing figures are like numbered and the foregoing description thereof shall suffice herefor.

In operation, the Redat circuit 60 (FIG. 2) is integral to the functionality of the present invention. Since the internal Y-clock is fired when the clock "CLK" (i.e. JWCLK 66) is "high", new data will appear on the IR 12 data bus and IF data bus when DQS(0:1) 62 transitions to a logic "low". Then for CLK=DQS=1, all Redat signals 100, 104 should be "off" and no propagation is allowed lest it disturb the write in progress. If the clock=0, and DQS(x)=0, then the status of $W_{COB}$ 64 ($W_{COB}$=CØ status at time of write command shifted 1 cycle) is evaluated to see whether Redat(0) 100 or Redat(1) 104 should be active.

Thus, the technique of the present invention enables both the rising data match (even or odd sorting) and the timing function. That is, it allows the IR 12 and IF 14 data to only proceed when it won't corrupt a current write and the two functions are completely integrated. Also, as shown, "A" data is written during the "YA" cycle (of $Y_{Even}$ and $Y_{Odd}$ signals 120$_{Even}$ and 120$_{Odd}$) while "B" data is written during the "YB" cycle for both the upper and lower data bytes regardless of the differing DQS 62 signal skews It should be noted that, in the case of multiple DQS signal devices (i.e. x16 memory devices), a separate Redat circuit 60 is dedicated to each set of I/O's (as shown in FIG. 3) matched with a particular DQS signal 62, thus allowing maximum skew between DQS-to-DQS pins, as long as the DQS-to-CLK skew is kept in range.

While there have been described above the principles of the present invention in conjunction with specific circuitry, device architecture and memory device type, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A data-in sort clock method for a memory device having an on-chip clock, data strobe and write address signals comprising:

evaluating a state of said write address signal when said on-chip clock and data strobe signals are both in a first logic state thereof;

setting a rising edge data signal to a second logic state if said write address signal is in a first logic state thereof during said step of evaluating;

allowing data transmission on an internal write bus of said memory device in response to said second logic state of said rising edge data signal;

setting said rising edge data signal to a first logic state if said data strobe and on-chip clock signals are both in a second logic state thereof;

disallowing further data transmission on said internal write bus of said memory device in response to said first logic state of said rising edge data signal; and maintaining said rising edge data signal in a previous logic state thereof if said data strobe and on-chip clock signals are in respectively differing logic states thereof.

2. The method of claim 1 wherein said step of setting said rising edge data signal to said second logic state further comprises the step of:

sorting data input to said memory device into an even or odd one of said internal write bus depending upon whether said write address signal is in a first or second logic state thereof.

3. A data-in sort clock circuit for a memory device having an on-chip clock, data strobe and write address signals comprising:

means for evaluating a state of said write address signal when said on-chip clock and data strobe signals are both in a first logic state thereof;

means for setting a rising edge data signal to a second logic state if said write address signal is in a first logic state thereof as determined by said means for evaluating;

means for allowing data transmission on an internal write bus of said memory device in response to said second logic state of said rising edge data signal;

means for setting said rising edge data signal to a first logic state if said data strobe and on-chip clock signals are both in a second logic state thereof;

means for disallowing further data transmission on said internal write bus of said memory device in response to said first logic state of said rising edge data signal; and means for maintaining said rising edge data signal in a previous logic state thereof if said data strobe and on-chip clock signals are in respectively differing logic states thereof.

4. The circuit of claim 3 wherein said means for setting said rising edge data signal to said second logic state further comprises:

means for sorting data input to said memory device into an even or odd one of said internal write bus depending upon whether said write address signal is in a first or second logic state thereof.

5. A data-in sort clock circuit for a memory device having an on-chip clock, data strobe and write address signals comprising:

first, second, third, fourth, fifth and sixth switching devices, each of said switching devices having control terminals thereof, said first, second, third, fourth and fifth switching devices being coupled in series between a supply voltage line and a reference voltage line, said data strobe signal being coupled to said control terminal of said first switching device, said write address signal being coupled to said control terminal of said second switching device and said on-chip clock signal being coupled to said control terminals of said third and fourth switching devices;

first and circuit nodes intermediate said first and second switching devices and said third and fourth switching devices respectively, said sixth switching device coupled between said supply voltage line and said first circuit node, said data sort signal being coupled to said control terminal of said fifth and sixth switching devices;

a latch coupled to said second circuit node for providing an output signal to a first rising edge data signal line; and at least one inverter coupling said output signal of said latch to a second complementary rising edge data signal line.

6. The circuit of claim 5 further comprising:

at least one delay element for coupling said data sort signal to said control terminal of said fifth and sixth switching devices.

7. The circuit of claim 6 wherein said at least one delay element comprises at least one inverter.

8. The circuit of claim 5 wherein said first, second, third, fourth, fifth and sixth switching devices comprise MOS transistors.

9. The circuit of claim 8 wherein said first, second, third and sixth switching devices comprise P-channel transistors.

10. The circuit of claim 8 wherein said fourth and fifth switching devices comprise N-channel transistors.

11. The circuit of claim 5 wherein said latch comprises first and second cross-coupled inverters.

12. The circuit of claim 5 wherein said output signal of said latch is furnished to said first rising edge data signal line through an even number of inverting stages.

13. The circuit of claim 5 wherein said at least one inverter comprises an odd number of inverting stages.

14. The circuit of claim 5 further comprising:

a seventh switching device coupled between said second circuit node and said reference voltage line, said seventh switching device for receiving a reset signal at a control terminal thereof for selectively resetting said latch.

15. The circuit of claim 14 wherein said seventh switching device comprises an MOS transistor.

16. The circuit of claim 15 wherein said seventh switching device comprises an N-channel transistor.

* * * * *